United States Patent
Doris et al.

(10) Patent No.: US 6,884,667 B1
(45) Date of Patent: Apr. 26, 2005

(54) FIELD EFFECT TRANSISTOR WITH STRESSED CHANNEL AND METHOD FOR MAKING SAME

(75) Inventors: Bruce B. Doris, Brewster, NY (US); Dureseti Chidambarrao, Weston, CT (US); Xavier Baie, Wavre (BE); Jack A. Mandelman, Flat Rock, NC (US); Devendra K. Sadana, Pleasantville, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/669,727

(22) Filed: Sep. 25, 2003

Related U.S. Application Data

(62) Division of application No. 10/318,601, filed on Dec. 12, 2002, now Pat. No. 6,717,216.

(51) Int. Cl.$^7$ ............................................. H01L 21/00
(52) U.S. Cl. ..................... 438/164; 438/296; 438/405; 438/424
(58) Field of Search ............................... 438/221, 296, 438/164, 165, 405, 424

(56) References Cited

U.S. PATENT DOCUMENTS

| | | | |
|---|---|---|---|
| 6,624,478 B1 * | 9/2003 | Anderson et al. | 257/353 |
| 6,680,240 B1 * | 1/2004 | Maszara | 438/455 |

* cited by examiner

*Primary Examiner*—Amir Zarabian
*Assistant Examiner*—Christy Novacek
(74) *Attorney, Agent, or Firm*—Whitham, Curtis & Christofferson, P.C.; Jay H. Anderson

(57) ABSTRACT

Field effect transistor with increased charge carrier mobility due to stress in the current channel 22. The stress is in the direction of current flow (longitudinal). In PFET device, the stress is compressive; in NFET devices, the stress is tensile. The stress is created by a compressive film 34 in an area 32 under the channel. The compressive film pushes up on the channel 22, causing it to bend. In PFET devices, the compressive film is disposed under ends 31 of the channel (e.g. under the source and drain), thereby causing compression in an upper portion 22A of the channel. In NFET devices, the compressive film is disposed under a middle portion 40 of the channel (e.g. under the gate), thereby causing tension in the, upper portion of the channel. Therefore, both NFET and PFET device can be enhanced. A method for making the devices is included.

4 Claims, 5 Drawing Sheets

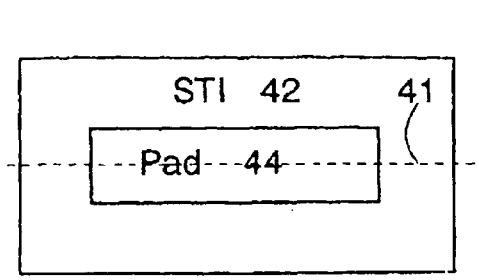
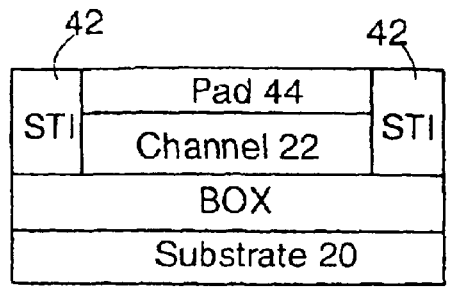
Fig. 3A  Fig. 3B
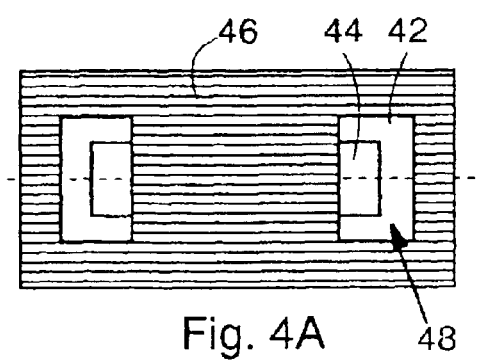
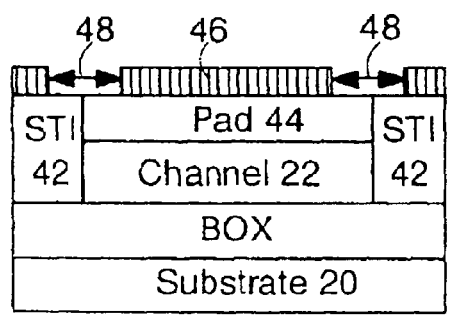
Fig. 4A  Fig. 4B
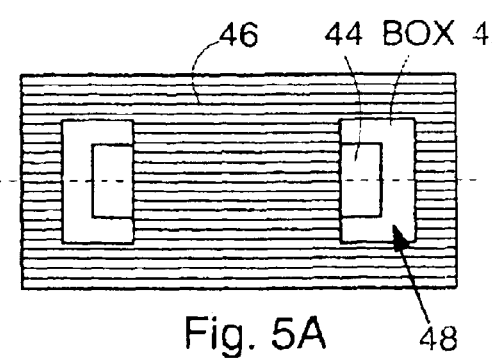
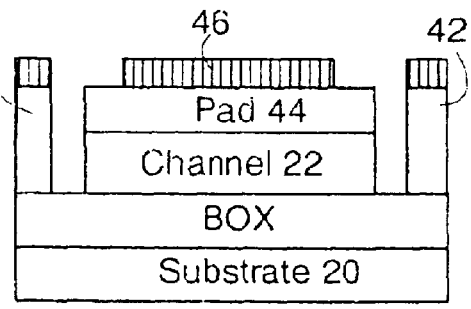
Fig. 5A  Fig. 5B
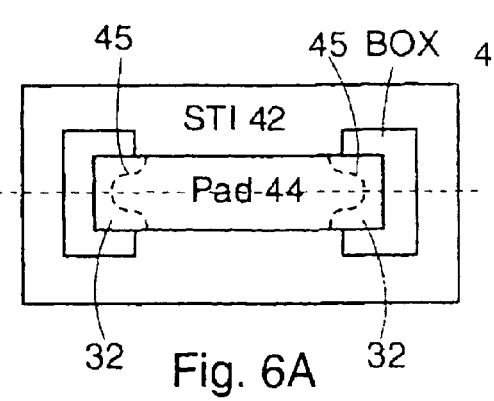
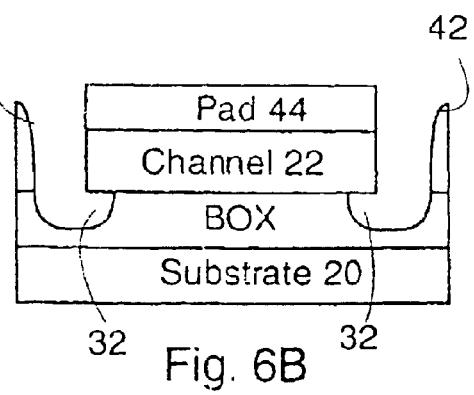
Fig. 6A  Fig. 6B

US 6,884,667 B1

FIELD EFFECT TRANSISTOR WITH STRESSED CHANNEL AND METHOD FOR MAKING SAME

This application is a division of U.S. patent application Ser. No. 10/318,601, filed Dec. 12, 2002, now U.S. Pat. No. 6,717,216.

BACKGROUND OF THE INVENTION

1. Field of the Invention

The present invention relates generally to field effect transistors such as CMOS transistors. More particularly, the present invention relates to a method for forming field effect transistors with stressed channel regions which provide increased drive current capability among other benefits.

2. Background Description

Field effect transistors such as CMOS transistors are widely used in the electronics industry. Field effect transistors (FETs) are employed in almost every electronic circuit application, such as signal processing, computing, and wireless communications. There is constantly a demand for improved field effect transistor performance. Performance metrics that may be of interest include switching speed, on-state current capability, and on-state to off-state current ratio. These metrics tend to be improved by increasing the charge carrier mobility of the FET. Hence, researchers have been searching for techniques to increase the charge carrier mobility of FETs.

It has been discovered that mechanical stress applied to the current channel of a FET can increase the charge carrier mobility. For example, Hamada et al. in "A New Aspect of Mechanical Stress Effects in Scaled MOS Devices" in IEEE Transactions on Electron Devices, Vol. 38, No. 4, April 1991 describes the results of experiments in which performance characteristics of P-type FET (PFET) and N-type FET (NFET) MOS transistors were measured as a function of mechanical stress. It was reported that longitudinal (in the direction of current flow) compression in PFET devices increased carrier mobility, and longitudinal tension in NFET devices increased carrier mobility.

However, incorporating mechanical stress into microfabricated FETs and CMOS devices has proven difficult. In the past, researchers have simply flexed the transistor substrate. However, this technique is not practical for mass producing integrated circuits. One significant problem with employing stress is that PFET and NFET devices require opposite stress. Also, the technique for producing stress in the devices must be compatible with present FET manufacturing practices and packaging techniques.

It would be an advance in the art to provide FETs having stressed channel regions. It would be particularly beneficial to be able to make PFET and NFETs having opposite stresses on the same substrate so that both PFET and NFETs are enhanced. Also it would be an advance to be able to make FETs with strained channel regions in a conventional FET fabrication process.

SUMMARY

The present invention includes a field effect transistor having a current channel, an undercut area under the channel, and a gate electrode disposed over the channel. A compressive film is disposed in the undercut area, and the compressive film creates longitudinal (in the direction of current flow) stress in the current channel.

Preferably, the type of stress (compressive or tensile) is selected so that the transistor has an increased charge carrier mobility. Specifically, the stress should be compressive in a PFET transistor, and tensile in a NFET transistor. To create compressive stress in a PFET transistor, the compressive film should be located under ends of the channel. To create tensile stress in a NFET transistor, the compressive film should be located under a middle portion of the channel.

The compressive film can be made of many materials such as oxidized polysilicon, oxidized amorphous silicon, silicon nitride, oxidized SiGe, or other compressive films.

The present invention includes a method for making a field effect transistor with longitudinal stress. The method includes forming an undercut area under the channel, and then forming a compressive film in the undercut area. The compressive film in the undercut area pushes up on the channel, thereby creating stress in the channel. The channel can be released in a middle portion. The undercut area can be formed by etching a buried oxide layer under the channel.

Also, the present invention includes a field effect transistor having a buried oxide layer, a channel disposed on the buried oxide layer, an undercut area under the channel, and a gate disposed over the channel. A compressive film is disposed in the undercut area, and the compressive film creates longitudinal stress in the channel. The undercut area may be formed by etching the buried oxide layer.

DESCRIPTION OF THE FIGURES

FIGS. 3A–8B illustrate a method for making a PFET according to the present invention.

DETAILED DESCRIPTION OF THE INVENTION

The present invention provides both NFET and PFET field effect transistors (e.g. CMOS devices) having stressed channel regions for enhanced charge carrier mobility. The present invention also provides a method for fabricating FETs with stressed channels. In the present invention, edges of the channel region are undercut (e.g. by an isotropic etchant). Then, a compressive film is deposited in the undercut areas. The compressive film pushes upwards on the channel from the undercut areas, thereby bending the channel, and inducing stress in the channel. Depending on the placement of the compressive thin film, the longitudinal stress in the channel will be compressive or tensile. The type of stress (i.e. compressive or tensile) is selected to produce desired performance alterations in the FET. Specifically, PFET devices require longitudinal compressive stress for charge mobility increase, and NFET devices require longitudinal tensile stress for charge mobility increase.

Figure 1:
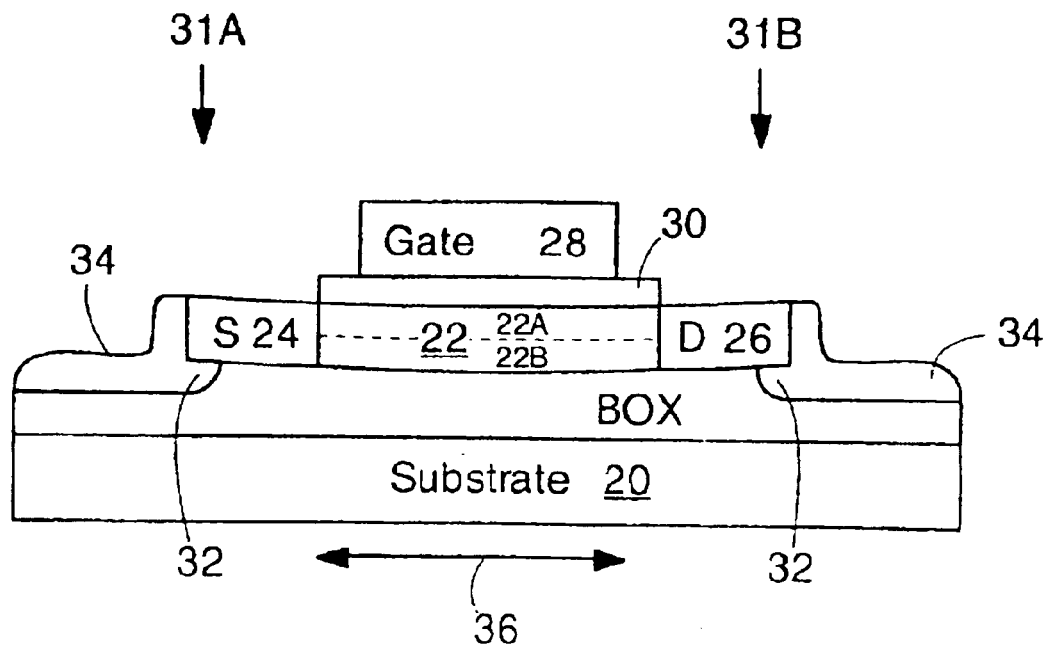
FIG. 1 shows a PFET according to the present invention.

FIG. 1 shows a side view of a PFET according to the present invention. A buried oxide layer (BOX) is disposed on a substrate 20. The substrate 20 can be made of silicon or other material and the BOX can be made of silicon dioxide. A current channel 22 is disposed on the BOX. Source region 24, and drain region 26 are connected to the channel 22. A gate 28 is disposed over the channel 22, and separated from the channel by a gate insulator 30 which can be made of thermal oxide, for example. The BOX has been etched (e.g. isotropically etched) so that undercut areas 32 are present at ends 31A and 31B of the channel 22. A compressive thin film 34 is disposed in the undercut areas 32. The compressive thin film 34 can comprise chemical vapor-deposited polysilicon or amorphous silicon or silicon-germanium that has been oxidized after deposition, silicon nitride, or silicon dioxide, for example. The longitudinal direction (i.e. the direction of current flow through the channel 22) is indicated by arrow 36. In the case of a silicon channel, the longitudinal direction 36 should be oriented in the <110>direction, and the wafer surface should be in the [100] plane, as known in the art. The present invention can be applied in transistors having other crystal orientations as well. FIG. 1 is not necessarily a functioning device; additional layers not shown in FIG. 2 (e.g. passivation layers) and electrical contacts and wiring may be present in a final, functioning device.

In the device of FIG. 1, an upper portion 22A of the channel 22 is in longitudinal compressive stress, and a lower portion 22B of the channel 22 is in longitudinal tensile stress. The stress in the upper and lower portions of the channel is caused by the compressive thin film 34 in the undercut areas 32. Specifically, the compressive thin film 34 pushes upwards on the ends 31A and 31B of the channel 22, causing the channel 22 to bend as shown (i.e. the channel is bent so that the channel is concave as viewed from above). The longitudinal compression of the upper portion 22A tends to increase charge carrier mobility, since the device of FIG. 1 is PFET. The increase in charge carrier mobility increases switching speed by increasing the onstate current capability without increasing the off-state current. Other benefits of increased charge carrier mobility are known in the art.

Figure 2:
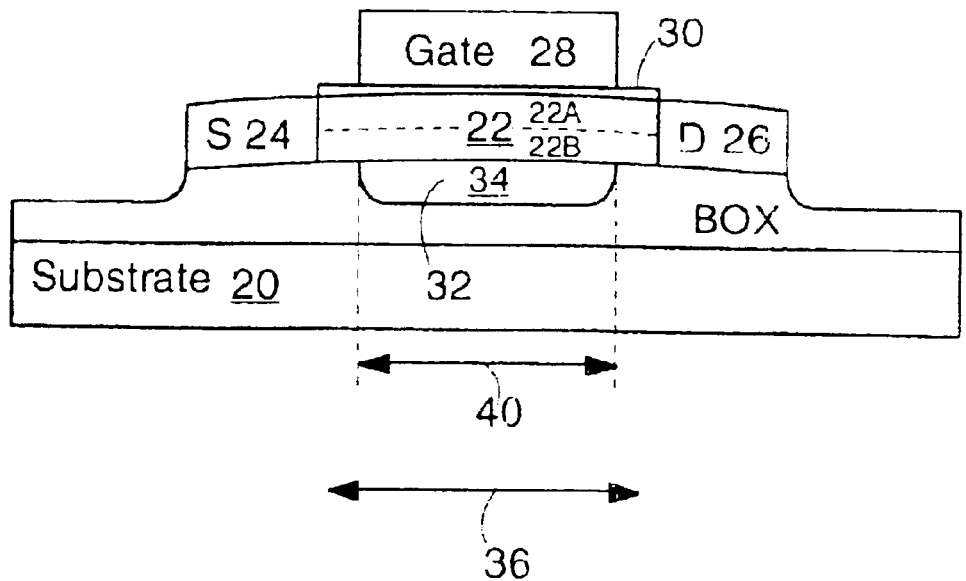
FIG. 2 shows a NFET according to the present invention.

FIG. 2 shows an embodiment of the invention where the device is an NFET. In an NFET, longitudinal tensile stress is required to increase charge carrier mobility. The embodiment of FIG. 2 has the source 24, drain 26, gate 28, BOX, and gate insulator 30. In the NFET, the undercut area 32 is disposed in a middle portion 40 of the channel, which is roughly under the gate 28. The ends 31A and 31B of the channel 22 (under the source 24 and drain 26) are not undercut, The compressive thin film 34 is disposed in the undercut area 32.

In the NFET of FIG. 2, the compressive thin film 34 pushes upwards on the middle portion 40 of the channel, causing the channel 22 to bend upwards in the middle portion 40 as shown. The channel is bent so that the channel 22 is convex as viewed from above. As a result, the upper portion 22A is in longitudinal tensile stress, and the lower portion 22B is in compressive stress. The longitudinal tensile stress in the upper portion provides increased charge carrier mobility. Charge carrier mobility will typically be decreased in the lower portion 22B since it has the opposite type of stress required for carrier mobility increase.

It is noted that, in most FETs, only a portion of the channel carries current. Specifically, current flows in a thin layer (e.g. about 2–20 nm thick) under the gate 28. Preferably, the present device is designed so that the current carrying volume of the channel 22 is entirely or mostly located within the upper portion 22A. The upper portion 22A is under compression in the PFET device, and under tension in the NFET device. If the charge carrying layer is thick, then the upper portion 22A should be thick. In some devices, the charge-carrying layer may extend all the way to the BOX. In this case, the upper portion 22A may extend all the way to the BOX. With the upper portion 22A designed to carry all the current, enhanced charge carrier mobility is ensured.

Following is a description of a method for making a PFET (device of FIG. 1) according to the present invention. FIGS. 3A–8B illustrate steps of the method. The 'B' figures are cross-sectional side views of the 'A' figures cut across dotted line 41; the 'A' figures are top views.

FIGS. 3A, 3B: FIG. 3A is a top view, and FIG. 3B is a cross-sectional side view of a starting structure for making the device of the present invention. It is well known in the art how to make the structure of FIGS. 3A and 3B. FIG. 3I is a cross-sectional view cut across dotted line 41 of FIG. 3A. Shallow trench isolation material (STI) as known in the art is deposited adjacent to the channel and pad. The STI material is typically tetraortho silicate (TEOS) or silicon dioxide deposited by a high density plasma process. The channel 22 can be made of silicon, and the pad 44 can be made of silicon nitride. The channel has the same shape as the pad, as seen in the top view of FIG. 3A (the channel may be formed by using the pad 44 as a mask). The channel can have a wide range of thicknesses, for example 2–200 nm.

FIGS. 4A, 4B: Mask layer 46 is deposited and patterned. The mask 46 has openings 48 that expose ends of the pad 44, and a U-shaped area of the STI 42. The mask 46 can be made of photoresist or a patterned hard mask material, for example. The openings 48 are located around ends of the channel 22 where compressive film 34 is to be deposited.

FIGS. 5A, 5B: Etching (e.g. anisotropic plasma etching) is performed so that the STI is removed from within the openings 48 and the BOX is exposed. The pad 44 is not etched.

FIGS. 6A, 6B: The BOX is etched so that the channel 22 is undercut in undercut areas 32. Dotted lines 45 in FIG. 6A indicate boundaries of the undercut areas 32. The undercut areas 32 are located at ends of the channel 22, which is appropriate for making a PFET device. The STI may also be etched during this process, which results in rounding of the bottom corners of the STI layer. In an alternative embodiment, silicon nitride spacers are formed on the sidewalls of the STI 42 to protect the STI sidewalls from etching. In another alternative embodiment, the BOX is completely removed in some locations so that the substrate is exposed.

Figure 7A:
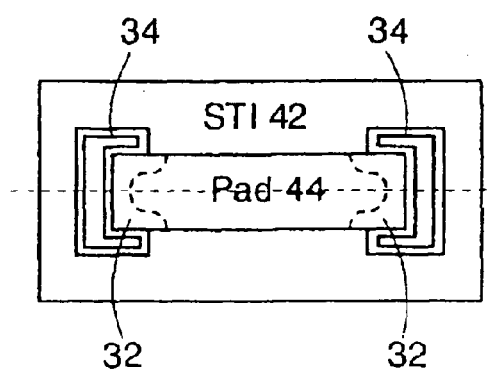
Figure 7B:
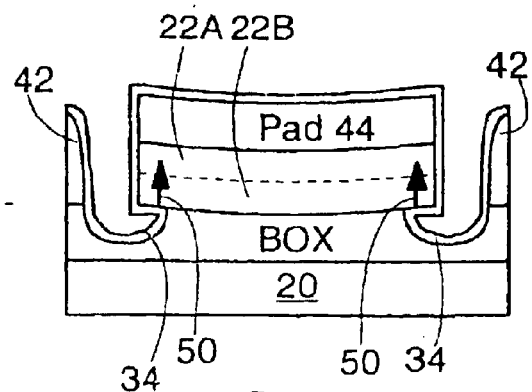

FIGS. 7A, 7B: Compressive film 34 is deposited in the undercut areas 32. The compressive film 34 is preferably conformal, such as that produced by a low-pressure chemical vapor deposition process. The compressive thin film 34 pushes upwards on the channel 22 in the direction of arrows 50, causing the channel to have a concave shape as viewed from above. The upper portion 22A of the channel is in compression, and the lower portion 22B is in tension due to pushing from the compressive film 34. In the case where the compressive film is oxidized silicon or oxidized SiGe, the compressive thin film can have a thickness in the range of about 5–1000 nm, for example. The thickness will depend on the amount of stress desired in the channel, and the amount of compression inherent in the compressive film 34.

Figure 8A:
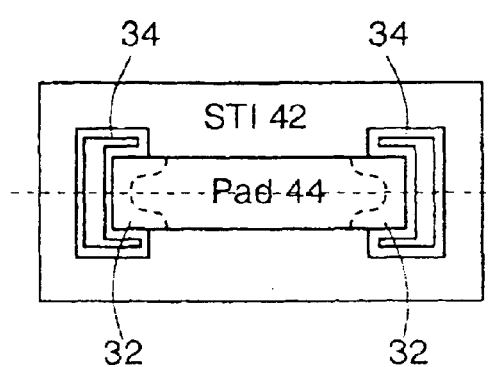
Figure 8B:
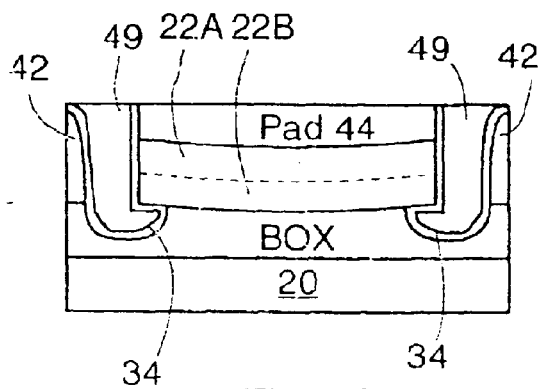

FIGS. 8A, 8B: The holes are filled with material such as oxide 49, and then the device is planarized (e.g. by chemical mechanical planarizing (CMP)). Then pad removal, gate oxidation, gate stack patterning, spacers, source drain implants, activation anneal and silicidation are performed to create a functioning FET, as known in the art of microelectronic fabrication. Passivation layers, and wiring patterns are also typically added.

Following is a description of a method for making a NFET (device of FIG. 2) according to the present invention. FIGS. 9A–13C illustrate steps of the method. The 'B' figures are cross-sectional side views of the 'A' figures cut across dotted line 43; the 'A' figures are top views. The 'B' Figures are magnified 2×for clarity.

Figure 9A:
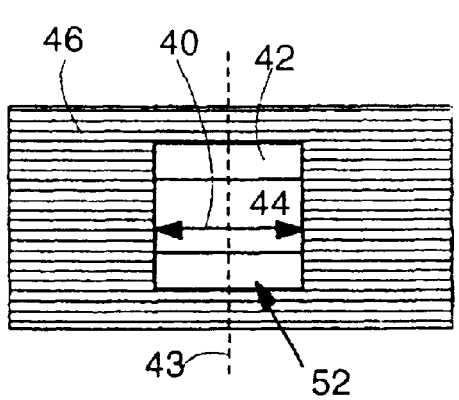
FIGS. 9A–13C illustrate a method for making a NFET according to the present invention.
Figure 9B:
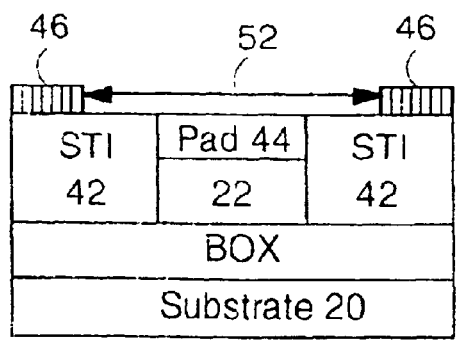

FIGS. 9A, 9B: Mask 46 is deposited on top of the structure of FIGS. 3A and 3B, Mask 46 is patterned to have an opening 52 above a middle portion 40 of the channel 22, as is appropriate for making an NFET. The opening 52 is wider than the channel 22 and pad 44 so that some of the STI 42 is exposed.

Figure 10A:
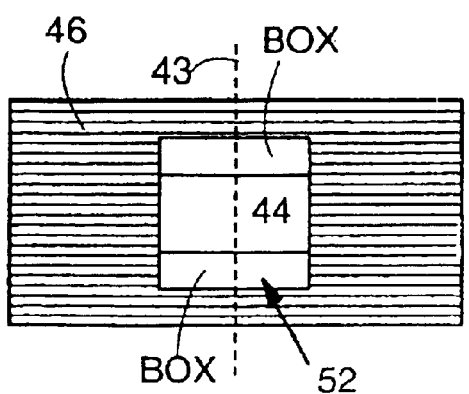
Figure 10B:
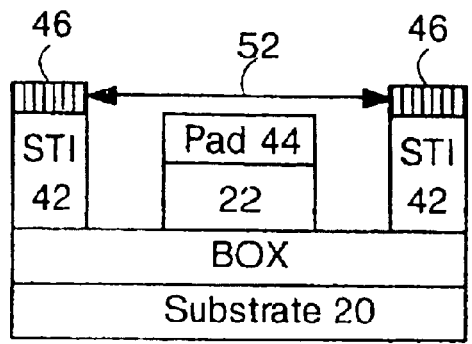

FIGS. 10A, 10B: Etching (e.g. anisotropic plasma etching) is performed so that the STI is removed from within the openings 52 and the BOX is exposed. The pad 44 is not etched.

Figure 11A:
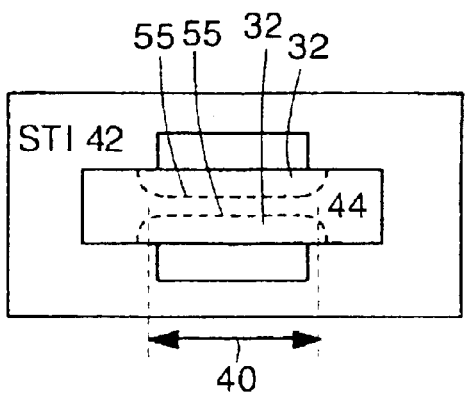
Figure 11B:
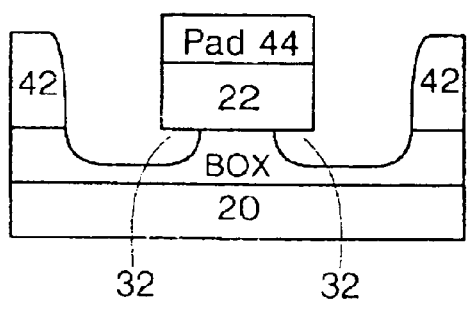

FIGS. 11A, 11B: The BOX is isotropically etched so that the channel 22 is undercut in the middle portion 40, and undercut areas are formed 32. Dotted lines 55 illustrate the edge of the undercut areas 32. The undercut areas 32 are located in the middle portion of the channel 22. In an alternative embodiment, silicon nitride spacers are formed on the sidewalls of the STI 42 to protect the STI sidewalls from etching. In an alternative embodiment, the BOX is etched until the undercut areas 32 are joined, and the middle portion 40 is released from the substrate.

Figure 12A:
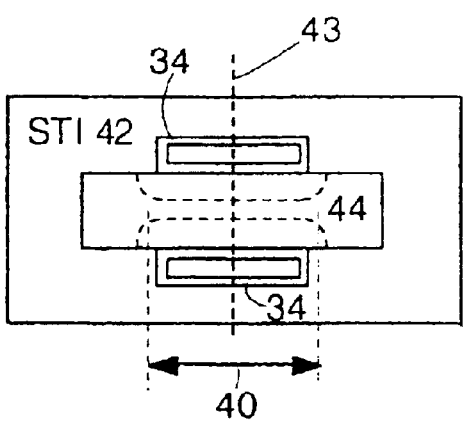
Figure 12B:
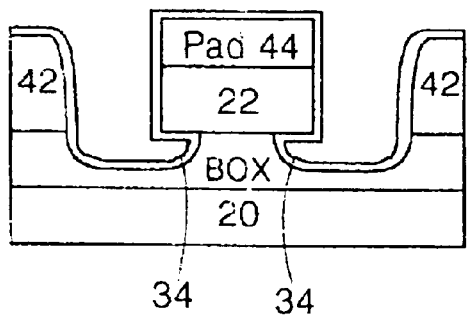

FIGS. 12A, 12B: Compressive film 34 is deposited in the undercut areas 32. The compressive film 34 pushes upward on the channel 22 in the middle portion 40 of the channel 22.

Figure 13A:
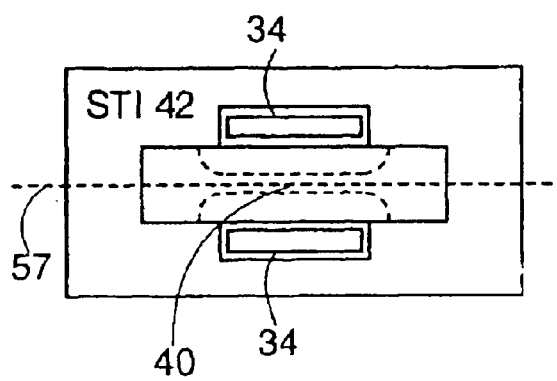
Figure 13B:
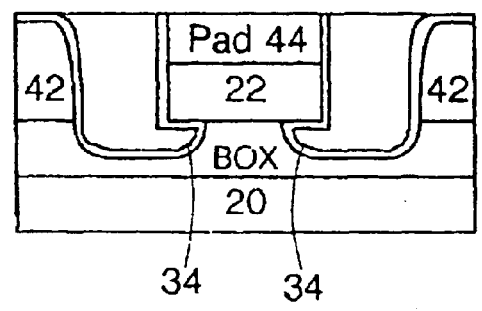

FIGS. 13A, 13B: Holes are filled with oxide 49, and then the device is planarized. Then, source and drain contacts, are formed, the gate is formed, and dopants are added to create a functioning field effect transistor, as is known in the art of microelectronic fabrication.

Figure 13C:
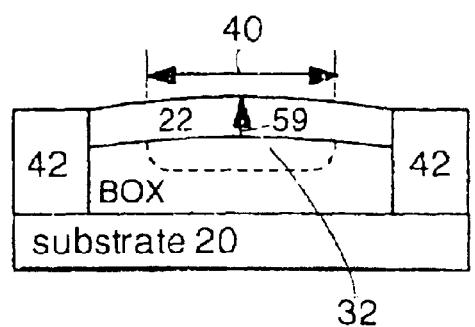

FIG. 13C is a cross-sectional side view of the device of FIG. 13A cut across the dotted line 57. The compressive film 34 pushes upward, in the direction of arrow 59, on the middle portion 40 of the channel 22. This creates longitudinal tensile stress in the upper portion of the channel, which is the portion of the channel that carries current. Hence, the carrier mobility of the NFET device is increased.

The PFET and NFET devices can be fabricated at the same time. For example, Mask 46 can be the same mask for the PFET and NFET devices, and the compressive film 34 can be deposited in the same step for both the PFET and NFET devices. This provides for efficient manufacturing of transistors according to the present invention.

In preferred embodiments of the present invention, the compressive thin film comprises oxidized polysilicon or oxidized amorphous silicon, although other compressive film material are also suitable.

The longitudinal stress provided in the present invention can provide a 10–20% increase in switching speed and on-state current capability compared to an equivalent transistor without longitudinal stress. This improvement in performance is significant and will help to reduce costs and increase the functionality of electronic circuits.

The channel of the present transistor can be made of many materials, including materials other than silicon such as germanium, silicon carbide, or gallium arsenide. It is noted that, in these and other materials, the dependence of mobility on stress may be different than in silicon. For example, in some material systems, mobility in a PFET may be increased by longitudinal tensile stress, and mobility in a NFET may be increased by longitudinal compressive stress. In this case, the PFET and NFET structures illustrated herein can be reversed. It is also noted that crystal orientation can affect the stress dependence of the channel. Furthermore, different materials may require different crystal orientations relative to current flow to achieve benefits from the applied stress.

It will be clear to one skilled in the art that the above embodiment may be altered in many ways without departing from the scope of the invention. Accordingly, the scope of the invention should be determined by the following claims and their legal equivalents.

What is claimed is:

1. A method for making a field effect transistor with a current channel with longitudinal stress, comprising the steps of:
   a) forming an undercut area under a middle portion of the channel; and
   b) forming a compressive film in the undercut area so that longitudinal stress is created in the channel.

2. The method of claim 1 wherein the channel is released in the middle portion.

3. The method of claim 1 wherein the undercut area is created by etching a buried oxide layer from under the channel.

4. The method of claim 1 wherein the compressive film is formed by depositing polysilicon and then oxidizing the polysilicon.

* * * * *